(12) United States Patent
Denzinger et al.

(10) Patent No.: US 6,294,298 B1
(45) Date of Patent: Sep. 25, 2001

(54) PIGMENTED RECORDING MATERIAL HAVING A BACKING COATING FOR THE PRODUCTION OF OFFSET PRINTING PLATES

(75) Inventors: Steffen Denzinger; Michael Doerr, both of Mainz; Andreas Elsaesser, Idstein; Guenther Hultzsch, Wiesbaden, all of (DE); Allen P. Gates, Knaresborough; Roland Robinson, Leeds, both of (GB)

(73) Assignee: Agfa-Gevaert N.V., Mortsel (BE)

( * ) Notice: Subject to any disclaimer, the term of this patent is extended or adjusted under 35 U.S.C. 154(b) by 0 days.

(21) Appl. No.: 09/504,951

(22) Filed: Feb. 16, 2000

(30) Foreign Application Priority Data

Feb. 26, 1999 (DE) .................................... 199 08 529

(51) Int. Cl.$^7$ .................................................... G03G 13/28
(52) U.S. Cl. ............................................ 430/49; 430/281
(58) Field of Search ....................................... 430/281, 49

(56) References Cited

U.S. PATENT DOCUMENTS

| 4,189,323 | 2/1980 | Buhr ........................................ 430/281 |
| 4,609,612 | * 9/1986 | Berner et al. ........................ 430/281 |

FOREIGN PATENT DOCUMENTS

| 0 490 515 | 6/1992 | (EP) . |
| 0 528 395 | 2/1993 | (EP) . |
| 2-40657 | 2/1990 | (JP) . |
| 6-202312 | 7/1994 | (JP) . |
| 9-265176 | 10/1997 | (JP) . |

* cited by examiner

*Primary Examiner*—John Goodrow
(74) *Attorney, Agent, or Firm*—Foley & Lardner (57) ABSTRACT

The invention relates to a recording material for the production of an offset printing plate, having a substrate on whose front a photosensitive image layer is present and on whose back a layer of an organic polymeric material having a glass transition temperature $T_g$ of 45° C. or more is present. The photosensitive image layer, or any top layer present thereon, has a pigment layer formed thereon.

29 Claims, 7 Drawing Sheets

PIGMENTED RECORDING MATERIAL HAVING A BACKING COATING FOR THE PRODUCTION OF OFFSET PRINTING PLATES

BACKGROUND OF THE INVENTION

1. Field of the Invention

The present invention relates to a recording material for the production of offset printing plates, which includes a metal substrate on whose front a photosensitive layer is present and on whose back a layer of an organic polymeric material having a glass transition temperature $T_g$ of 45° C. or more is present.

2. Description of the Related Art

Recording materials for the production of offset printing plates are usually delivered in stacks of 20 or more. After a relatively long storage time, at high pressure and/or elevated temperature, the individual plates frequently stick to one another and scratches may form in the photosensitive layer, on the back of the substrate during transport, or on removal of the plates from the stack. To prevent this, paper sheets are usually placed between the plates. In in-line packing systems, the interleaf paper is typically automatically inserted between the plates. This step is relatively slow and also susceptible to errors.

Such interleaves are particularly necessary in the case of recording materials having an aluminum substrate without a backing coating. The paper can, however, have an undesirable effect on the photosensitive layer and change it. For example, components of the paper can produce a change in the pH and in the photosensitivity and/or cause more rapid aging of the photosensitive layer. With surface-sealed papers, the problem can be reduced. However, such papers are substantially more expensive.

In the printing works, the plate stacks are processed on automatic lines in turn. The interleaf paper is typically removed by blowing the paper out from between the stacks. This reduces processing time and is susceptible to faults. Moreover, the interleaf paper cannot be re-used and must be disposed of as waste. According to Japanese Patent Publication No. A 2-040,657, this problem is minimized for a recording material having an aluminum substrate, which comprises a photosensitive layer on one side and a UV-cured layer of photopolymerizable material on the other side. The layer applied to the back may also contain photosensitizers, thermal polymerization inhibitors, binders, fillers and other additives in addition to the monomers. This layer may also act as a dulling layer.

Japanese Patent Publication A 6-202,312 discloses a recording material for the production of offset printing plates. The aluminum substrate of the recording material is coated on the back with an organic polymer, such as, for example, polyethylene, polypropylene, polybutadiene, polyester, polycarbonate, polyvinyl acetal, polyvinyl chloride, polystyrene or a methacrylate resin. According to the publication, the attack by aqueous alkaline developer on the aluminum substrate is reduced by the presence of the backing coating. The photosensitive layer in the recording material contains from 1 to 10% by weight of a compound insoluble in the developer.

Japanese Patent Publication A 9-265,176 discloses a recording material having an anodized aluminum substrate, a photopolymerizable layer on the aluminum oxide layer produced by the anodization and a 0.1 to 8.0 μm thick backing coating. The coating includes a saturated copolymerized polyester resin, a phenoxy resin, a polyvinyl acetal or a vinylidene chloride copolymer, each having a glass transition temperature $T_g$ of 20° C. or more. According to the publication, scratching of the plates during transport in the stack as well as delamination of the radiation-sensitive layer as a result of excessively strong adhesion to the back of the plate present on top are to be prevented.

European Patent Publication No. A 528,395 describes a recording material for the production of offset printing plates. The material can be stacked without interleaf paper. The recording material includes an aluminum substrate with a 0.01 to 8.0 μm thick layer of an organic polymeric material having a glass transition temperature of not less than 20° C. on the back of the substrate and a photosensitive layer on the front of the substrate. A discontinuous dulling layer which comprises particles having a mean diameter of not more than 100 μm and an average height of not more than 10 μm is formed on the photosensitive layer. The weight of the dulling layer is from 5 to 200 mg per square meter. The dulling layer aids the removal of air between photographic negative and photosensitive layer in the vacuum contact printing frame. The dulling layer can be produced, for example, by spraying a solution of a methyl methacrylate/ethyl acrylate/acrylic acid terpolymer, some of whose carboxyl groups are present in salt form, on the photosensitive layer in an electrostatic field with the aid of an atomizing bell rotating at about 25,000 rpm. In general, the dulling layer is soluble in water or aqueous alkali. However, dulling layers, in particular those of a material having a low glass transition temperature, tend to stick to the back of the plate present on top in the stack. Relatively large parts of the radiation-sensitive layer can thus become detached, so that the recording material may no longer be used.

European Patent Publication No. A 490,515 relates to a presensitized printing plate which, after imagewise exposure, is developed with an aqueous alkali metal silicate solution. To prevent developer from dissolving aluminum from the back of the plate, the back of the plate is provided with an organic polymeric coating which is insoluble in the developer. The coating contains polymers, such as polyethylene, polypropylene, polybutene, polybutadiene, polyamide, polyurethane, polyurea, polyimide, polysiloxane, polycarbonate, epoxy resins, polyvinyl chloride, polyvinylidene chloride or polystyrene. The polymer may also comprise a heat-curing or photochemically curing component.

SUMMARY OF THE INVENTION

One object of the invention is to overcome the disadvantages of the known art. It is therefore an object of the invention to provide a radiation-sensitive recording material for the production of lithographic printing plates, which material can be stacked without interleaf paper. In one aspect of the invention, the plates should be capable of being removed undamaged from the stack, even after prolonged storage, after the action of elevated temperatures, and/or after transport for a relatively long time. In addition, it is an aspect of the present invention that the plates should permit short evacuation times in the vacuum contact printing frame. Furthermore, during development, the aqueous alkaline developer should be only slightly contaminated with aluminum hydroxide.

According to one aspect of the invention, the objects of the invention may be achieved by pigmenting the front of the plate. Spacers may be embedded in the radiation-sensitive layer or a top layer may be present thereon. Preferably, any top layer is a continuous layer.

The present invention accordingly relates to a recording material for the production of an offset printing plate having a substrate on whose front a photosensitive image layer is present and on whose back a layer of an organic polymeric material having a glass transition temperature $T_g$ of 45° C. or more is present, wherein the photosensitive layer, or any top layer present thereon, is pigmented.

According to one aspect of the present invention, the pigmenting material is generally an inorganic material which is essentially insoluble in water. The mean particle size of the pigmenting particles is preferably from about 0.1 to about 20 µm, preferably from about 1 to about 15 µm, most preferably from about 3 to about 5 µm. The amount of the pigmenting compositions is chosen such that the surface of the recording material has a Bekk smoothness which is preferably <1000 seconds, more preferably from about 20 to about 250 seconds, as determined according to DIN 53 107, method A.

In one aspect of the invention, the pigmenting compositions are silicic acid products which have a mean particle size of from about 3 to about 5 µm and a cutoff of about 15 µm. In a preferred embodiment, the silicic acid products are combined with a surfactant, in particular a surfactant having siloxane units. The amount of the surfactant present is from about 0.01 to about 2% by weight, based on the dry weight of the radiation-sensitive layer. In a preferred embodiment, silicic acid products which have been rendered water-repellent or have been chemically modified are preferred. A preferred method to render the products water-repellent is with a wax. Preferred chemically modified silicic acid products are modified with silanes.

According to the invention, "silicic acid products" are defined as synthetic silicic acids and silicates according to DIN 55 921. Thus, both pure $SiO_2$ and metal oxide-containing silicic acids (e.g. aluminum silicates) are contemplated by the present invention, even if an exact distinction between the two is not possible. The term "silicic acid product" is therefore similar to the usual expression "silica", which does not, or does not always, distinguish between silicic acids and silicates. The silicic acid products used may be, for example, ®Syloid types from Grace, ®Silcron from Lanco, ®Gasil from Crosfield, OK/HK types from Degussa and ®Satintone from Engelhard-Chemie.

"Mean particle size" is to be understood as meaning the 50% value of the cumulative mass or volume distribution curve, as specified in the corresponding DIN method 66 141. "Cutoff" denotes the 100% value. This DIN method describes the principles for plotting the particle size distributions which applies to all particulate substances, regardless of the type of fineness feature measured. Various methods are available for determining the characteristic values, such as sedimentation measurements, image analysis evaluation of electron micrographs, conductivity measurements and light scattering.

The amount of silicic acid product which is required for achieving a Bekk smoothness of <1000 seconds, and preferably a Bekk smoothness of from about 20 to about 250 seconds, varies considerably. Bekk smoothness is dependent on the mean particle size of the dulling particles, as well as the layer weight of the radiation-sensitive layer, or the top layer, and the roughness of the substrate surface. However, it was unexpected that the desired effect could be achieved with the relatively hard inorganic dulling agents and that no scratches were observed, even after prolonged storage, under pressure or after transport of the plates in the stack.

As already described, the silicic acid fillers may be contained in the photosensitive layer or in a top layer present thereon. It is also possible for an unpigmented, transparent top layer to be present on a pigmented radiation-sensitive layer. However, this layer should not be too thick, i.e. the mean particle size of the dulling particle must be greater than the total thickness of photosensitive layer and top layer together.

Further objects, features and advantages of the present invention will be readily apparent to those skilled in the art from the detailed description which follows.

DETAILED DESCRIPTION OF THE PREFERRED EMBODIMENTS

Figure 1:
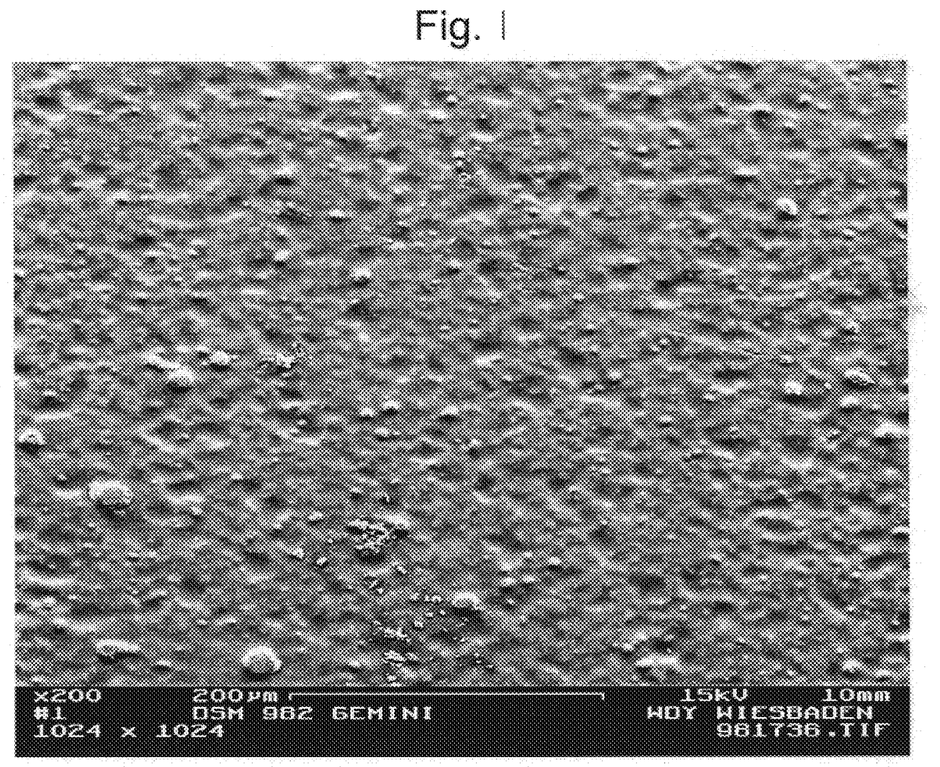
FIG. 1 is a scanning electron micrograph of the front of the recording material according to the invention, from Example 16, after storage.
Figure 2:
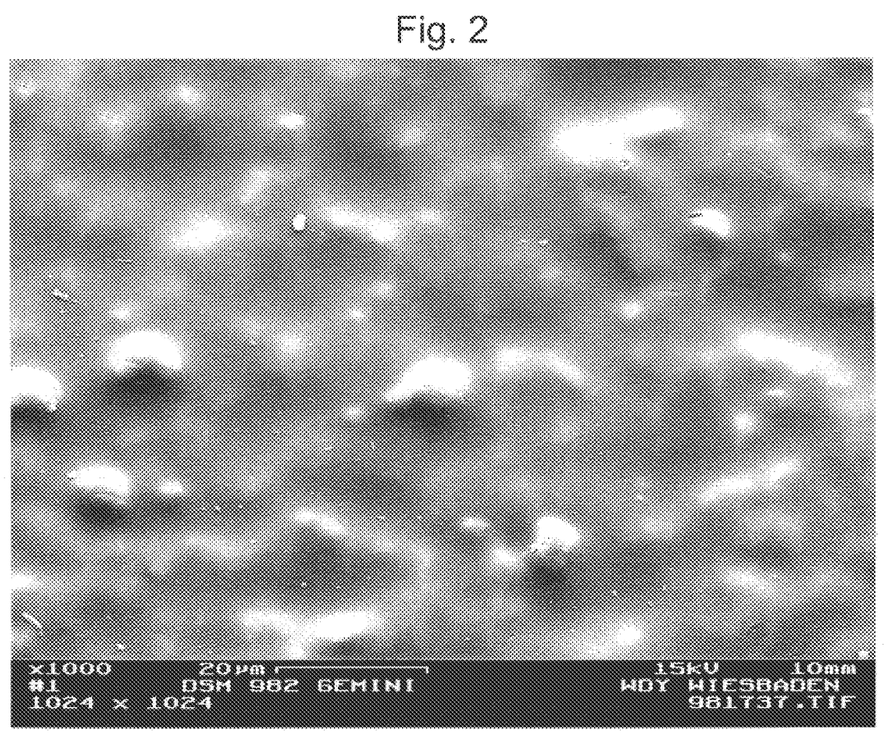
FIG. 2 shows a surface of FIG. 1 under higher magnification.
Figure 3:
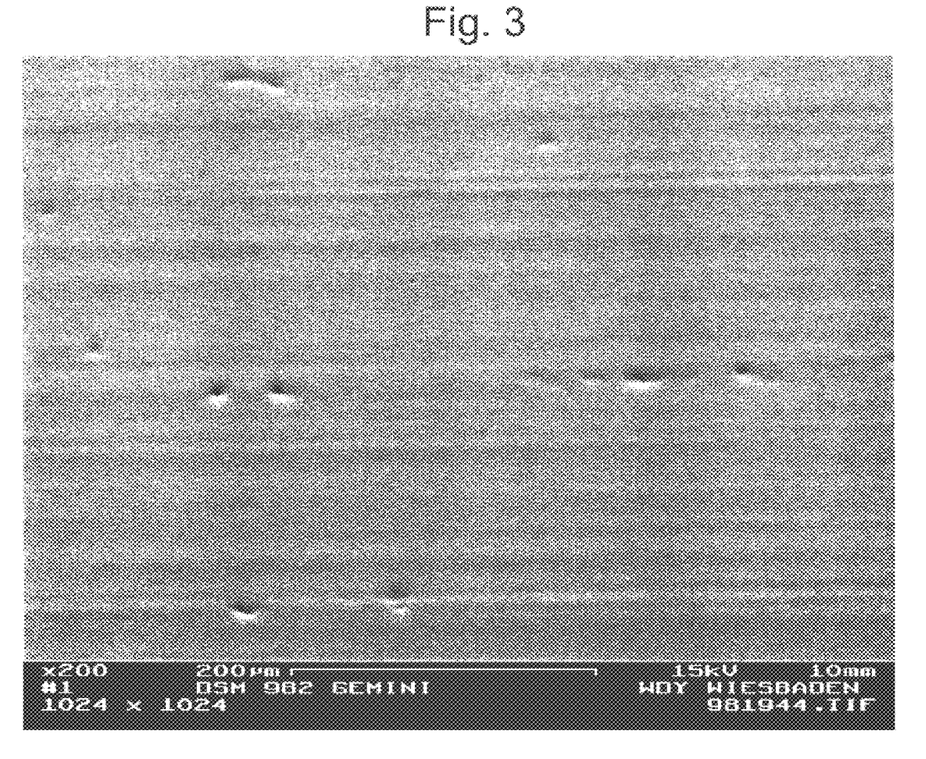
FIG. 3 illustrates a back of the recording material from Example 16 after storage where no adhesion or sticking is visible.
Figure 4:
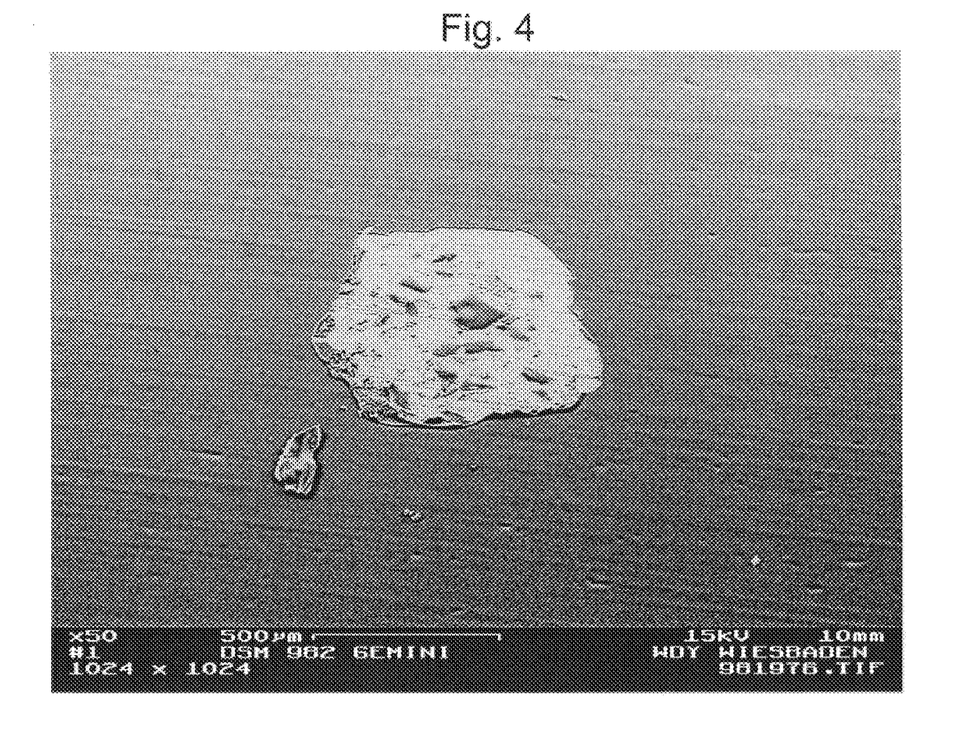
FIG. 4 illustrates the back of the recording material from Comparative Example 17 after storage where adhesions are clearly visible.
Figure 5:
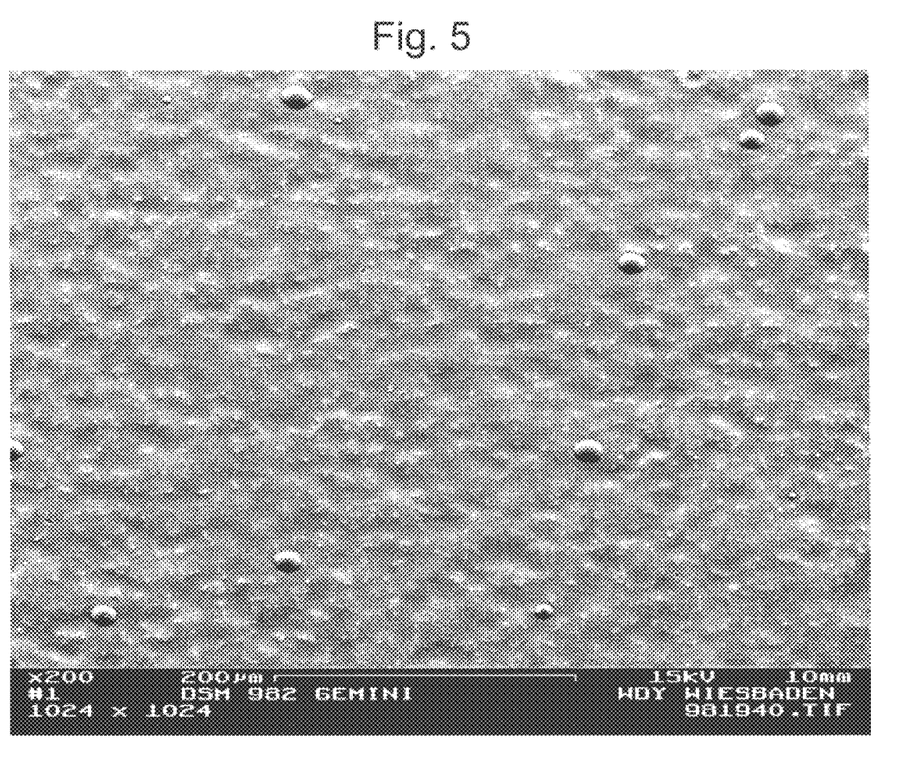
FIG. 5 illustrates the front of the recording material from Comparative Example 22 before storage.
Figure 6:
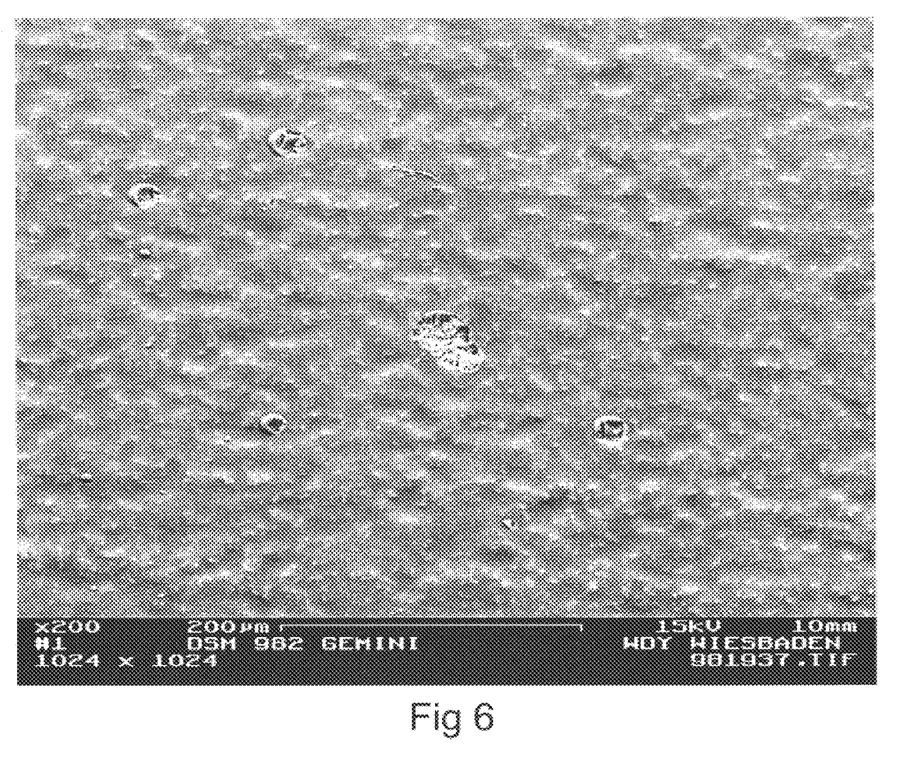
FIG. 6 illustrates the surface of Comparative Example 22 after storage.
Figure 7:
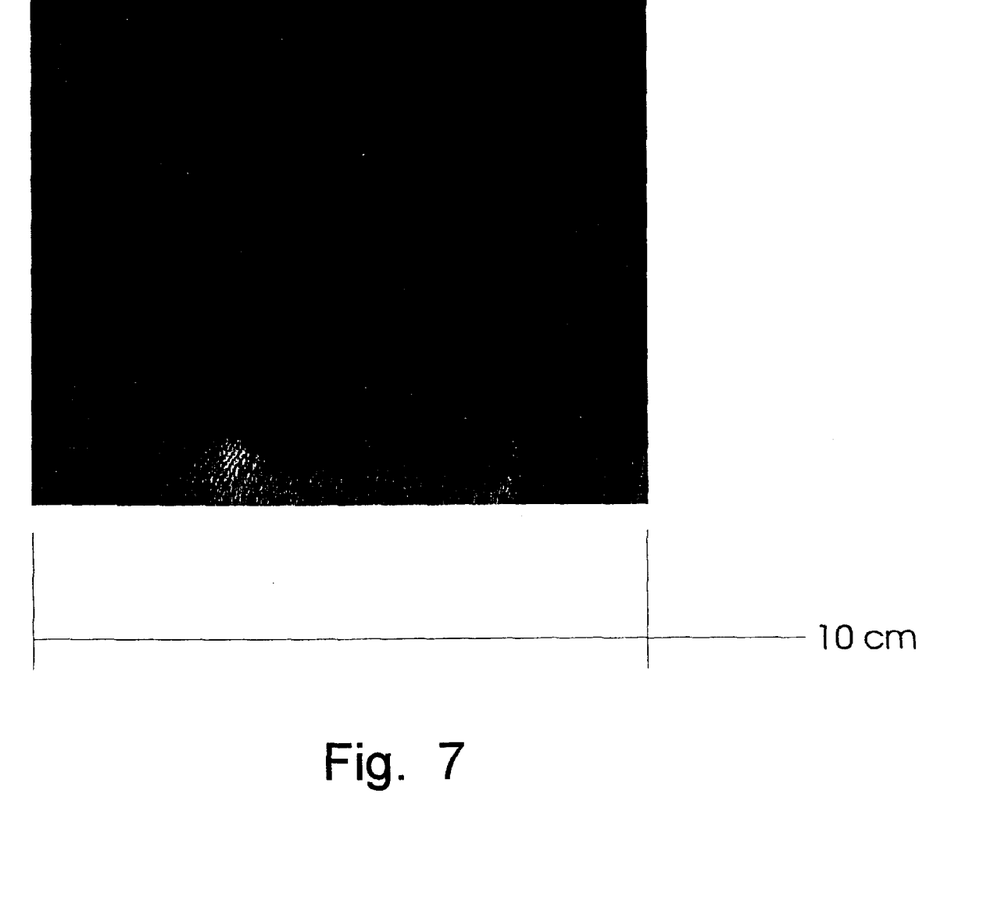
FIG. 7 illustrates the result which was achieved with a printing plate which was produced from the stored recording material according to Comparative Example 22.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that changes may be made without departing from the spirit and scope of the present invention.

Bekk smoothness is determined according to DIN 53 107, method A. According to this method, Bekk smoothness is determined as the time within which the pressure in the vacuum container for the measured sample increases from −507 mbar to −489 mbar as a result of the air volume sucked through being measured.

The pigmenting composition is preferably present in an amount of from about 0.01 to about 10% by weight, preferably from about 0.1 to about 5% by weight, based on the dry weight of the layer. The silicic acid products which may be used for pigmenting can be modified by coating, for example with wax, or by reaction, for example with silanes, to achieve render the products more dispersible.

The surfactants used in the present invention are preferably dialkylsiloxanes, which may additionally be modified by alkylene oxide units or acid units. The amount of surfactant present for satisfactory coating without halation is dependent upon the amount of filler present. Generally, from about 0.01 to about 2% by weight, preferably from about 0.05 to about 1%, by weight, based on the dry weight of the layer, is sufficient.

Products such as ®Tegoglide, ®Tegopren (Goldschmidt AG), ®Edaplan (Münzing), ®Byk (Byk-Chemie), ®Baysilon (Bayer AG) or various silicone oils from Wacker-Chemie GmbH may also find use as surfactants in the present invention.

The radiation-sensitive layer itself may be either positive- or negative-working. The radiation-sensitive layer preferably has a layer weight of from about 0.1 to about 6 g/m$^2$, more preferably from about 0.5 to about 4 g/m$^2$.

The radiation-sensitive compound for positive-working mixtures may be, for example, a quinonediazide compound. Preferably the quinonediazide compounds are those which are intended for exposure in the wavelength range from about 350 to 450 nm. Preferably the quinonediazide compound is a naphthoquinonediazide compound. Combinations of compounds which form a strong acid on exposure to radiation and compounds which contain at least one C—O—C bond cleavable by an acid are also as the radiation-sensitive compound for positive-working mixtures. Mixtures which are to be exposed to IR radiation in the range from about 750 to about 1100 nm may contain, for example, carbon black as a heat sensitizers in the case of broad band sensitization or methine dyes as spectral sensitizers.

The quinonediazide compounds for use as a radiation-sensitive compound for positive-working mixtures are preferably 1,2-quinonediazides. The 1,2-quinonediazides are preferably 1,2-naphthoquinone-2-diazide-4- or 5-sulfonic esters or -sulfonamides. The esters of 1,2-naphthoquinone-2-diazide-4- or -5-sulfonic acid and 2,5-dihydroxybenzophenone, 2,3,4-trihydroxybenzophenone, 2,3,4-trihydroxy-4'-methylbenzophenone, 2,3,4-trihydroxy-4'-methoxybenzophenone, 2,3,4,4'-trihydroxybenzophenone, 2,3,4,2',4'-pentahydroxybenzophenone, 5,5'-dialkanoyl-2,3,4,2',3',4'-hexahydroxydiphenylmethane (especially 5,5'-diacetyl-2,3,4,2',3',4'-hexahydroxydiphenylmethane) or 5,5'-dibenzoyl-2,3,4,2',3',4'-hexahydroxydiphenylmethane are most preferred. The polyhydroxy compounds involved are as most preferably partially esterified. The amount of the 1,2-quinonediazide compound(s) present may be from about 3 to about 50% by weight, preferably from about 7 to about 35% by weight, based on the total weight of the nonvolatile components of the radiation-sensitive layer.

It is also possible to use the esters or amides of the 1,2-quinonediazide compounds with the polymers according to the invention if they contain reactable hydroxyl or amino groups. The esterification/amidation of the corresponding 1,2-quinonediazidesulfonic acids or 1,2-quinonediazidecarboxylic acids with the hydroxyl and/or amino groups of the parent polymers is carried out by processes which are known to a person skilled in the art.

Particularly suitable acid-cleavable compounds are:

A) compounds at least one orthocarboxylic ester and/or carboxamidoacetal group, where it is possible for these compounds to have polymeric character and for the groups to occur as linking elements in the main chain or as pendant substituents, B) oligomer and polymer compounds having repeating acetyl and/or ketal groups in the main chain, and C) compounds having at least one enol ether or N-acyliminocarbonate group.

Acid-cleavable compounds of type (A) as components of radiation-sensitive mixtures are known to those having ordinary skill in the art and are described in detail in European Patent No. 022,571-A. Mixtures which contain compounds of type (B) are known to those having ordinary skill in the art and are disclosed in German Patent Publication No. 23 06 248-C and German Patent Publication No. 27 18 254-C. Compounds of type (C) are known to those having ordinary skill in the art and are disclosed in European Patent No. 006,626-A and European Patent No. 006 627-A. The amount of the cleavable compound in the present invention is preferably from about 5 to about 70% by weight, most preferably from about 5 to about 40% by weight, based on the total weight of the nonvolatile components of the radiation-sensitive layer.

A large number of known compounds and mixtures, such as phosphonium, sulfonium and iodonium salts, halogen compounds and organometallic-organohalogen combinations are also suitable as radiation-sensitive components which may form or eliminate a strong acid on exposure to radiation.

The phosphonium, sulfonium and iodonium compounds are preferably used in the form of their salts which are soluble in organic solvents, generally as a precipitated product with complex acids, such as tetrafluoroboric acid, hexafluorophosphoric acid, hexafluoroantimonic acid and hexafluoroarsenic acid.

In principle, all organic halogen compounds, also known as photochemical free radical initiators, for example those having at least one halogen atom on a carbon atom or on an aromatic ring, can be used as halogen-containing radiation-sensitive compounds forming a hydrohalic acid. Among these compounds, the s-triazine derivatives having halomethyl groups, in particular trichloromethyl groups, and an aromatic or unsaturated substituent in the triazine nucleus are preferred. These compounds are described in U.S. Pat. No. 4,189,323, which is herein incorporated by reference. 2-Trihalomethyl-[1,3,4]oxadiazoles may also be used suitable. The effect of these halogen- containing compounds can also be spectrally influenced and increased by known sensitizers.

The amount of initiator may differ depending on its chemical nature and the composition of the layer. Advantageous results may be obtained if the amount of initiator is from about 0.1 to about 10% by weight, preferably from about 0.2 to about 5% by weight, based on the total weight of the nonvolatile components of the layer. Particularly, for copying layers having thicknesses of more than 0.01 mm, it is advisable to use a relatively small amount of acid donor.

The photosensitive image layer can also be based on a positive-working thermal system. In particular, carbon black particles or IR-absorbing dyes are suitable for achieving sensitization to IR or heat radiation. As known to those skilled in this art, "IR-sensitive" is understood to mean that the mixture or the layer formed therefrom is sensitive to radiation having a wavelength of from about 700 to about 1100 nm. Carbon black pigments are therefore particularly suitable as IR-absorbing components since they absorb over a wide IR wavelength range. However, it is also possible to use other compounds which absorb in the IR range, such as, for example, suitably substituted phthalocyanines (e.g. PRO-JET 830 or PRO-JET 950 NP from Zeneca Specialist Colors) or methine dyes, for IR sensitization. Mixtures sensitive to IR radiation are known to those skilled in the art and are disclosed, for example, in German Patent Publication No. A 197 12 323, German Patent Publication No. A 197 39 302, European Patent Publication No. A 0 625 728 and European Patent Publication No. 0 780 239.

The radiation-sensitive layer may also be an electrophotographic layer. In this case, it may contain an organic photoconductor, sensitizer and organic polymeric binder.

The radiation-sensitive compound for negative-working mixtures may be, for example, a compound having diazonium salt groups or a system capable of free radical polymerization which includes photoinitiator(s) and ethylenically unsaturated compounds capable of free radical polymerization, or a combination of these components.

Other suitable radiation-sensitive components are positive-working photo-conductors or a mixture of photo-conductors and sensitizers.

Oligomeric or polymeric compounds suitable for negative-working layers and having diazonium salt groups are known to a person skilled in the art. They can be prepared in a customary manner by condensation of a diazo monomer as described in European Patent Publication No. 152,819-A. The compounds are prepared with a condensing agent, such as, for example, formaldehyde, acetaldehyde, propionaldehyde, butyraldehyde, isobutyraldehyde or benzaldehyde or aldehydes having acidic units, such as, for example, para-formylbenzoic acid. Co-condensates which, in addition to the diazonium compounds, may also contain other, nonphotosensitive units derived from condensable compounds may be used. The condensable compounds may be chosen from, for example, aromatic amines, phenols, phenol ethers, aromatic thioethers, aromatic hydrocarbons, aromatic heterocycles or organic acid amides, which may also be substituted by acidic units. Particularly preferred diazonium polycondensates are reaction products of diphenylamine-4-diazonium salts, which may contain a methoxy group in the phenyl radical carrying the diazo group, with formaldehyde or 4,4'-bis-methoxymethyldiphenyl ether. A suitable anion of these diazo resins may be, for example, an aromatic sulfonate, such as toluene-4-sulfonate or mesitylenesulfonate. Compounds having diazonium salt groups are known to the person having ordinary skill in the art and are disclosed in European Patent Publication No. 030,862-A. Compounds described in particular include those having groups of the formula:

where:
- A⁻ is an anion,
- Ar is an aromatic or heteroaromatic radical,
- R is a single bond or an unsubstituted or substituted aliphatic and/or aromatic radical,
- Y is an oxygen or sulfur atom, and
- X and X', are independently an oxygen atom, a sulfur atom or an unsubstituted or substituted imino group, wherein at least one of the radicals X and X' being an unsubstituted or substituted imino group.

The amount of the oligomeric or polymeric compound(s) having diazonium salt groups according to the present invention may be from about 3 to about 60% by weight, based on the total weight of the nonvolatile components of the photosensitive mixture.

The negative-working photosensitive component may also be a photopolymerizable system. The photopolymerizable system may be composed of photoinitiators which absorb in the range from about 300 to about 1100 nm and ethylenically unsaturated components capable of (free radical) polymerization. Suitable photoinitiators are, for example, parent substances or derivatives of acetophenone, benzophenone, trichloromethyl-(1,3,5)triazine, benzoin, benzoin ethers, benzoin ketals, xanthone, thioxanthone, acridine, porphyrin or hexaarylbisimidazole. These may be used in combination with a metallocene, which may be substituted as known in the art and as described in European Patent Publication No. A 0 364 735. The component capable of free radical polymerization is preferably an acrylic or methacrylic acid derivative having one or more unsaturated groups. Most preferably the component capable of free radical polymerization is an ester of (meth)acrylic acid. The component capable of free radical polymerization may be a monomer, oligomer or prepolymer. The component capable of free radical polymerization may be present in solid or in liquid form, however, solid and viscous forms are preferred. The compounds which are suitable as monomers include, for example, trimethyl-olpropane tri(meth)acrylate, pentaerythrityl hexa(meth)acrylate, dipentaerythrityl penta(meth) acrylate, dipentaerythrityl hexa(meth)acrylate, pentaerythrityl tetra-(meth)acrylate, 1,1,1,3,3,3-hexamethylolpropane tetra(meth)acrylate (also referred to as "ditrimethylolpropane tetra(meth)acrylate"), diethylene glycol di(meth) acrylate, triethylene glycol di(meth)acrylate or tetraethylene glycol di(meth)-acrylate. Particularly preferred ethylenically unsaturated compounds capable of free radical polymerization include acrylic esters or alkylacrylic esters having at least one group photooxidizable on exposure in the presence of the initiator, in particular an amino, urea, thio or enol group, and the reaction products of triethanolamine or N,N'-(2-hydroxyethyl)piperidine with isocyanatoethyl methacrylate or of tri-ethanolamine and 2,2,4-trimethylhexamethylene diisocyanate with glycidyl acrylate. Finally, other monomers or co-monomers which may be used are maleimide, dimethylmaleimide and other derivatives of maleimide. Suitable oligomers or prepolymers may be, for example, polyurethanes, epoxy resins or polyesters or unsaturated polyester resins which contain polymerizable, ethylenically unsaturated groups. Specific examples of the oligomers or prepolymers include (meth)acrylate, vinyl or maleate groups.

The amount of the photoinitiators is preferably present in an amount of from about 0.5 to about 20% by weight and that of the compound capable of free radical polymerization present in an amount of from about 5 to about 80% by weight, based on the total weight of the nonvolatile components of the photosensitive mixture.

A combination of the diazonium polycondensates with a system capable of free radical polymerization and comprising photoinitiators and ethylenically unsaturated compounds which are capable of free radical polymerization may have advantages for certain applications. Such hybrid systems preferably contain from about 1 to about 50% by weight of diazonium polycondensates, from about 0.5 to about 20% by weight of photoinitiators and from about 5 to about 80% by weight of the compounds capable of free radical polymerization.

In addition, numerous other oligomers and polymers may be concomitantly used, such as, for example, phenol resins of the novolak type or vinyl polymers, such as polyvinyl acetals, poly(meth)acrylates, polyvinyl ethers and polyvinylpyrrolidones, which, if required, have themselves been modified by co-monomers.

To produce an imagewise color contrast immediately after exposure, the layers may additionally contain a combination of indicator dyes and radiation-sensitive components which form strong acids on exposure, as described in detail above.

The amount of the photochemical acid donor varies, depending on its chemical nature and the composition of the layer. Advantageous results may be obtained where the photochemical acid donor is present from about 0.1 to about 10% by weight, based on the total weight of the nonvolatile components of the layer.

Cationic dyes such as triphenylmethane dyes, in particular in the form of their carbinol bases, and the methine dyes may be used as indicator dyes.

Soluble or finely divided, dispersible dyes and UV absorbers, surfactants, polyglycol derivatives and pigments may also be added to the radiation-sensitive mixture.

The substrate preferably includes a dimensionally stable, sheet-like or foil-like material. Preferably the material includes a metal. Aluminum or aluminum alloys are particularly preferred as the stable material. Aluminum substrates may be used in bright rolled form or may be mechanically and/or chemically roughened and optionally also anodized prior to use. The aluminum substrates may also be chemically pretreated, such as, for example, with polymers or polycondensates containing units having phosphonic acid, carboxylic acid or sulfonic acid groups. The polycondensates may optionally also contain units having basic groups, such as, for example, amino groups. Silicates, phosphates, fluorides or fluoro complexes may also be utilized as a pretreatment. A plurality of these pre-treatments may also be combined. Finally, metal/plastic laminates, such as, for example, aluminum/polyester laminates, are also suitable as substrates.

The backing coating according to the present invention generally includes an organic polymer material having a glass transition temperature, $T_g$, of 45° C. or more. The thickness of the backing coating may be from about 0.1 to about 20 µm, preferably from about 0.5 to about 10 µm, most preferably from about 1 to about 8 µm. The backing coating is essentially insoluble in water and aqueous alkaline developers. The polymeric material may include, for example, polyolefin (such as polyethylene, polypropylene, polybutylene, polybutadiene or polyisoprene), polyester, polycarbonate, polyamide, polysiloxane, polystyrene, homo- or copolymers of or with, respectively, alkyl acrylate or alkyl methacrylate units (such as polymethyl methacrylate (PMMA) or styrene/methyl methacrylate copolymers), polyvinyl acetal, phenoxy resins (for example resins of bisphenol A and epichlorohydrin), polyvinyl chloride or polyvinylidene chloride. The backing coating may additionally contain minor amounts of additives, such as plasticizers, dyes, pigments, silicone compounds, surfactants or other compositions for establishing the desired surface properties.

In addition to said polymeric materials, the backing coating may also include compounds which undergo polymerization, condensation or crosslinking under the action of heat and/or radiation. Examples of these compounds include, acrylates or methacrylates capable of addition polymerization, such as, for example, ethyl (meth)acrylate, propyl (meth)acrylate, butyl (meth)acrylate, 2-hydroxyethyl methacrylate, trimethylolpropane mono-, di- or tri(meth)acrylate or pentaerythrityl tri(meth)acrylate, and in addition (meth)acrylamides, such as N-methyl-, N-ethyl-, N-propyl-, N-butyl- or N-isobutyl(meth) acrylamide, allyl esters, such as allyl acetate, vinyl ethers, such as butyl vinyl ether, octyl vinyl ether, decyl vinyl ether, 2-methoxyethyl vinyl ether, diethylene glycol vinyl ether or benzyl vinyl ether, polyfunctional urethane acrylates which cure under the action of UV radiation and polyurethanes which cure under the action of heat may be mentioned. In the present application, "(meth)acrylate" represents "acrylate and/or methacrylate". The same applies to (meth)acrylamide and other derivatives of acrylic acid or methacrylic acid. The backing coating may also be photosensitive. To make a distinction therefrom, the photosensitive layer on the front of the substrate is referred to as the "photosensitive image layer", because only this is exposed imagewise and developed.

To produce the backing coating, the components may be dissolved or dispersed in a suitable, generally organic solvent and applied to the substrate. The solvent is then removed by heating and/or under reduced pressure. If mechanically, chemically and/or electrochemically treated aluminum substrates are used, the coating may be applied before or after the treatment thereof. It should be understood that the coating may also be applied by spin-coating or pouring on or with the aid of doctor blades, flowers or other apparatuses.

The recording material according to the invention is exposed imagewise and developed by the methods known to the person having ordinary skilled in the art. Preferably, the recording material is first exposed imagewise through a photographic negative or positive in a vacuum contact printing frame. Carbon arc lamps, mercury vapor lamps, xenon lamps or similar light sources may be used for the exposure. Direct imaging without photographic film ("computer-to-plate") is also possible. The imagewise exposed or irradiated recording material is then developed, usually with an aqueous alkaline solution. This solution typically contains an alkali metal silicate and an alkali metal hydroxide or ammonium hydroxide. The solution may optionally contain carbonates, phosphates, borates, alkyl-, dialkyl- or trialkylamines, alkanoic acids, minor amounts of at least partially water-miscible organic solvents and/or surfactants.

The following Examples serve to illustrating the invention. The Examples should not be construed to limit the present invention, but instead serve to illustrate preferred embodiments thereof. The abbreviation "pbw" represents "part(s) by weight". Percentages are percentages by weight, unless stated otherwise. Comparative experiments and comparative materials are indicated by an asterisk (*).

SUBSTRATES (I) A 300 µm thick aluminum foil roughened in dilute hydrochloric acid (with an Rz value of 5.0 µm according to DIN 4768), subjected to intermediate pickling and anodization in dilute, aqueous sulfuric acid (weight of the aluminum oxide layer produced by the anodization: 3.5 g/m$^2$) and hydrophilized with phosphonomethylated polyethyleneimine and with polyvinylphosphonic acid (corresponding to DE-A 44 23 140), (II) a 400 µm thick aluminum foil roughened in dilute hydrochloric acid (Rz value 5.0 µm according to DIN 4768), subjected to intermediate pickling and anodization in dilute sulfuric acid (oxide weight 4.0 g/m$^2$) and hydrophilized with polyvinylphosphonic acid, and (III) a 300 µm thick aluminum foil roughened in dilute nitric acid (Rz value 6.0 µm according to DIN 4768), subjected to intermediate pickling and anodization in dilute sulfuric acid (oxide weight 2.0 g/m$^2$) and hydrophilized with polyvinylphosphonic acid.

The above were provided as substrate and were provided on the back thereof with one of the coatings (a) to (d) according to Table 1, and on the front with one of the radiation-sensitive layers (A) to (H) or (J) described below. The layers A, C, D, E and H are positive-working and the others are negative-working.

The backing coatings were applied with a doctor blade and dried in a forced-draft oven at 120° C. for 2 min, while the coatings on the front were produced by spin-coating and dried in a forced-draft oven at 125° C. for 1 min.

TABLE 1

| Layer | Layer components | Layer thickness after drying, in μm |
|---|---|---|
| a | 10 pbw of a styrene/methyl methacrylate copolymer having a T$_g$ of 54° C. and 90 pbw of 2-butanone (methyl ethyl ketone) | 3 μm |
| b | 10 pbw of a UV-curable coating comprising 90 pbw of a hexafunctional urethane acrylate (®Sartomer CN-975 from Sartomer), 5 pbw of an α-hydroxy ketone (®Esacure KIP 100F from Sartomer), 2 pbw of methyldiethanolamine from Elf Atochem and 3 pbw of benzophenone and 90 pbw of 2-butanone (curing was carried out by exposure to a UV lamp from IST (80 W) for 1 min; distance from the lamp: 30 cm) | 10 μm |
| c | 10 pbw of a thermally crosslinked polyurethane (®Desmotherm 2170 from Bayer AG) and 90 pbw of 2-butanone | 11 μm |
| d | 10 pbw of a polymethyl methacrylate having a T$_g$ of 49° C. and 90 pbw of a mixture of 2-butanone (90%) and xylene (10%) | 5 μm |

RADIATION SENSITIVE LAYERS

A 7.8 pbw of a cresol/formaldehyde novolak having a hydroxyl number of 420 (according to DIN 53 783/DIN 53 240) and an average molecular weight M$_w$ of 6,000, determined by gel permeation chromatography (GPC) using a polystyrene standard,
  3.2 pbw of an esterification product of 1.5 mol of 1,2-naphthoquinone-2-di-azide-5-sulfonyl chloride and 1 mol of 2,3,4-trihydroxybenzophenone,
  0.4 pbw of 1,2-naphthoquinone-2-diazide-5-sulfonyl chloride,
  0.2 pbw of Victoria Pure Blue (color index No. 44 045),
  0.1 pbw of a silica gel filler having a mean particle size of 4 μm,
  to 100 pbw with a mixture of 50% tetrahydrofuran (THF) and 50% of 1-methoxypropan-2-ol After subsequent drying, the layer weight was 2 g/m².

B 62 pbw of a polyvinyl butyral functionalized with maleic anhydride and having an average molecular weight M$_w$ of about 80,000, which contains 71% of vinyl butyral units, 2% of vinyl acetate units and 27% of vinyl alcohol units,
  21 pbw of a diazonium polycondensate prepared from 1 mol of 3-methoxydiphenylamine-4-diazonium sulfate and 1 mol of 4,4'-bis-methoxymethyl-diphenyl ether in 85% strength phosphoric acid, isolated as mesitylene sulfonate,
  2.5 pbw of phosphoric acid,
  3.0 pbw of Victoria Pure Blue FGA (Basic Blue 81),
  0.7 pbw of phenylazodiphenylamine,
  0.1 pbw of a silica gel filler having a mean particle size of 3 μm in
  2570 pbw of ethylene glycol monomethyl ether, and
  780 pbw of 2-butanone.

After subsequent drying, the layer weight was 0.9 g/m².

C 4.7 pbw of a cresol/formaldehyde novolak having a hydroxyl number of 420 (determined according to DIN 53 783/DIN 53 240) and an average molecular weight M$_w$ of 6,000, determined by GPC with polystyrene standard,
  1.9 pbw of a polyacetal obtained from ethylbutyraldehyde and triethylene glycol,
  0.23 pbw of 2-(4-styrylphenyl)-4,6-bis-trichloromethyl-s-triazine,
  0.02 pbw of Crystal Violet,
  0.1 pbw of a silica gel filler having a mean particle size of 4 μm
  to 100 pbw with a mixture of 90% of 2-butanone and 10% of ethylene glycol monomethyl ether.

After subsequent drying, the layer weight was 1.9 g/m².

D* according to Example 1 of EP-A 528 395
  4.5 pbw of an esterification product of 1,2-naphthoquinone-2-diazide-5-sulfonyl chloride and a pyrogallol/acetone resin,
  11 pbw of a cresol/formaldehyde novolak,
  0.2 pbw of 2-(4-methoxyphenyl)-4,6-bis-trichloromethyl-s-triazine,
  0.1 pbw of oil blue # 603 (obtainable from Orient Chemical Industries Co. Ltd.),
  0.04 pbw of a fluorine surfactant (®Megafac F 177 from Dainippon Inc. and Chemicals Inc.) in
  100 pbw of 2-butanone and
  100 pbw of propylene glycol monomethyl ether.

After subsequent drying, the layer weight was 2.0 g/m².

A dulling layer was applied to this layer by electrostatic spray coating. For this purpose, a 12% strength solution of a methyl methacrylate/ethyl acrylate/acrylic acid copolymer (weight ratio 65:20:15) in which a part of the carboxyl groups had been neutralized was prepared and was sprayed onto the photosensitive layer at 25° C. and 50% relative humidity using a spray bell (25,000 revolutions per min). The spray bell had a voltage of −90 kV relative to the substrate to be dulled. The spray-dulled substrate was sprayed 2.5 s later with steam and then dried by blowing on hot air at 60° C. (10% humidity) for 5 s. Dulling particles having an average height of 6 μm and an average dimension of 30 μm formed on the photosensitive layer. The dulling material had a weight of about 0.15 g/m².

E* 7.8 pbw of a cresol/formaldehyde novolak having a hydroxyl number of 420 (determined according to DIN 53 783/DIN 53 240) and an average molecular weight M$_w$ of 6,000, determined by GPC using polystyrene standard,
  3.2 pbw of an esterification product of 1.5 mol of 1,2-naphthoquinone-2-diazide-5-sulfonyl chloride and 1 mol of 2,3,4-trihydroxybenzophenone,
  0.4 pbw of 1,2-naphthoquinone-2-diazide-5-sulfonyl chloride,
  0.2 pbw of Victoria Pure Blue (C.I. 44 045),
  to 100 pbw with a mixture of 50% of THF and 50% of 1-methoxypropan-2-ol.

After subsequent drying, the layer weight was 1.9 g/m².

A discontinuous dulling layer was then applied with electrostatic support to the photosensitive layer thus produced. For this purpose, a solution of 35% of a cresol/formaldehyde novolak and 65% of ethylene glycol ethyl ether acetate (conductivity of the solution: 1.2×10$_7$ pSi m$^{-1}$) was sprayed on at 30° C. with the aid of an electrostatic apparatus provided with a capillary. The tip of the capillary was present at a distance of 30 cm from the photosensitive layer; the voltage of the capillary relative to the substrate was −30 kV. The spray rate was 0.70 cm³/min. The dulling particles produced in this manner had a diameter of 30 to 40 μm after drying. They did not penetrate the radiation-sensitive layer.

F 4.5 pbw of a maleic anhydride/methyl methacrylate copolymer having an acid number of from 100 to 120 and an average molecular weight M$_w$ of 100,000,
  2.0pbw of a urethane acrylate (®Plex 6661 from Röhm AG), 3.0 pbw of a reaction product of 1 mol of hexamethylenediamine and 2 mol of 2-hydroxyethyl methacrylate,
0.35 pbw of phenylacridine,
0.10 pbw of Leuco Crystal Violet,
0.05 pbw of Crystal Violet,
0.1 pbw of a silica gel filler having a mean particle size of 4 μm,
to 100 pbw with a mixture of 70% of glycol ether (®Dowanol) and 30% of 2-butanone.

After subsequent drying, the layer weight was 1.0 g/m². A further layer produced from
7 pbw of a polyvinyl alcohol having 12% of acetate groups,
0.01 pbw of a fatty alcohol ethoxylate having on average 8 ethylene oxide units, to 100 pbw with water
was applied to this layer and dried. The weight of this top layer was 2.0 g/m².

G 4.5 pbw of a maleic anhydride/methyl methacrylate copolymer having an acid number of from 100 to 120 and an average molecular weight $M_w$ of 100,000,
2.0 pbw of a urethane acrylate (®Plex 6661 from Röhm AG),
3.0 pbw of a reaction product of 1 mol of hexamethylenediamine and 2 mol of 2-hydroxyethyl methacrylate,
0.35 pbw of phenylacridine,
0.10 pbw of Leuco Crystal Violet,
0.05 pbw of Crystal Violet,
to 100 pbw with a mixture of 70% glycol ether (®Dowanol) and 30% of 2-butanone.

After subsequent drying, the layer weight was 0.9 g/m². A mixture of
7 pbw of a polyvinyl alcohol having 12% of acetate groups,
0.1 pbw of a silica gel filler having a mean particle size of 4 μm,
0.01 pbw of a fatty alcohol ethoxylate having on average 8 ethylene oxide units,
to 100 pbw with water
was applied to this layer and dried. The weight of this top layer was 1.8 g/m².

H 9.7 pbw of a cresol/formaldehyde novolak having a hydroxyl number of 420 (determined according to DIN 53 783/DIN 53 240) and an average molecular weight $M_w$ of 6,000, determined by GPC using polystyrene standard,
0.8 pbw of poly(4-hydroxystyrene) having an $M_w$ of from 4,000 to 6,000 and an $M_w$ of 2,100 to 3,100 (®Maruka Lyncur M, type S-2, from Maruzen Petrochemical Co. Ltd.),
0.1 pbw of a silica gel filler having a mean particle size of 3 μm,
8.0 pbw of a carbon black dispersion comprising
5.00 pbw of carbon black (special black 250 from Degussa AG),
66.00 pbw of the Novolak binder described above (30% strength in gamma-butyrolactone),
28.99 pbw of γ-butyrolactone and
0.01 pbw of silicone antifoam (RC 31 from Agfa-Gevaert AG),
40 pbw of propylene glycol monomethyl ether,
31 pbw of acetone and
10.5 pbw of y-butyrolactone.

After subsequent drying, the layer weight was 2 g/m².

J 62 pbw of a polyvinyl butyral functionalized with maleic anhydride and having an average molecular weight $M_w$ of about 80,000, which contains 71% of vinyl butyral units, 2% of vinyl acetate units and 27% of vinyl alcohol units,
21 pbw of a diazonium polycondensate prepared from 1 mol of 3-methoxy-diphenylamine-4-diazonium sulfate and 1 mol of 4,4'-bis-methoxymethyl-diphenyl ether in 85% strength phosphoric acid, isolated as mesitylene sulfonate,
2.5 pbw of phosphoric acid,
3.0 pbw of Victoria Pure Blue FGA (Basic Blue 81),
0.7 pbw of phenylazodiphenylamine and
0.1 pbw of a silica gel filler having a mean particle size of 0.5 μm in
2570 pbw of ethylene glycol monomethyl ether and
780 pbw of 2-butanone.

After subsequent drying, the layer weight was 0.35 g/m².

The behavior of the recording materials on storage in a stack and during processing was tested.

The resistance of the radiation-sensitive recording materials to various processing chemicals frequently used during development or during printing was tested. For this purpose, they were treated a) for 4.5 min with an aqueous alkaline developer comprising
0.12 mol of $Na_2Si_3O_7$,
0.48 mol of potassium hydroxide,
5.0 g of sodium pelargonate,
1.0 g of nonylphenol polyethylene glycol ether having on average 10 ethylene oxide units,
0.1 g of silicone antifoam (RC 31 from Agfa-Gevaert AG),
to 11 with demineralized water;

b) for 1 min with pure isopropanol or c) for 1 min with a 40% strength aqueous diacetone alcohol solution.

In the case of the materials according to the invention, less than 30% of the backing coating were removed with a) and in some cases substantially less than 10% with each of b) and c).

The shelf life was tested as follows: a stack of 20 plates was loaded with a 5 kg weight for 48 hours at 70° C. and the damage to the layer was rated as follows:

+=no damage at all
0=slight damage
−=considerable adhesion

The results are listed in the following table:

| Example | Substrate | Back | Copying layer | Shelf life |
|---|---|---|---|---|
| 1 | I | a | A | + |
| 2 | II | a | A | + |
| 3 | III | b | B | + |
| 4 | II | c | C | + |
| 5 | II | b | A | + |
| 6 | I | a | B | + |
| 7 | II | c | B | + |
| 8 | III | a | B | + |
| 9 | III | c | B | + |
| 10 | II | b | C | + |
| 11 | II | c | A | + |
| 12 | III | a | C | + |
| 13 | I | d | A | + |
| 14 | II | d | B | + |
| 15 | III | d | C | + |

-continued

| Example | Substrate | Back | Copying layer | Shelf life |
|---------|-----------|------|---------------|------------|
| 16      | II        | d    | A             | +          |
| 17*     | III       | a    | D*            | −          |
| 18*     | II        | a    | E*            | −          |
| 19*     | III       | c    | D*            | −          |
| 20*     | I         | b    | E*            | −          |
| 21*     | II        | d    | D*            | −          |
| 22*     | II        | d    | E*            | −          |
| 23      | I         | a    | F             | +          |
| 24      | II        | d    | G             | +          |
| 25      | I         | c    | H             | +          |
| 26      | II        | b    | J             | +          |
| 27      | II        | d    | F             | +          |
| 28      | II        | b    | G             | +          |
| 29      | III       | a    | H             | +          |
| 30      | II        | d    | J             | +          |

*Comparative examples or comparative materials

In the exemplary embodiments described, the storage elements or enclosures are always shown as substantially flat elements. However, it is also possible for enclosures of similar cross-sectional shape in their longitudinal extent to be shaped into a curved path as an arc or even into a ring. Furthermore, it is possible to arrange a plurality of accumulator elements in the form of a spiral, in which case the turns of the spiral are at a sufficient distance apart for the heat-transfer medium to flow through.

Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

German Patent Application No. 199 08 529.3 filed on Feb. 26, 1999 including the specification, figures, and abstract is expressly incorporated by reference in its entirety.

What is claimed as new and desired to be protected by Letters Patent of the United States is:

1. A recording material for the production of an offset printing plate, comprising:
    a substrate;
    a photosensitive image layer formed on the front of said substrate; and
    a backing layer formed on the back of said substrate, wherein said backing layer includes an organic polymeric material having a glass transition temperature $T_g$ of 45° C. or more, and wherein said photosensitive image layer or any top layer present includes at least one pigment formed thereon.

2. The recording material as set forth in claim 1, wherein the at least one pigment includes an inorganic material which is essentially insoluble in water.

3. The recording material as set forth in claim 1, wherein the mean particle size of the pigment particles is from about 0.1 to about 15 μm.

4. The recording material as set forth in claim 1, wherein the mean particle size of the pigment particles is from about 0.5 to about 10 μm.

5. The recording material as set forth in claim 1, wherein the mean particle size of the pigment particles is from about 3 to about 5 μm.

6. The recording material as set forth in claim 2, wherein the pigment includes a silicic acid product.

7. The recording material as set forth in claim 6, wherein the silicic acid product is combined with a surfactant.

8. The recording material as set forth in claim 7, wherein the surfactant includes siloxane units.

9. The recording material as set forth in claim 7, wherein the surfactant is present from about 0.01 to about 2% by weight, based on the dry weight of the layer.

10. The recording material as set forth in claim 1, wherein the amount of the pigment is from about 0.01 to about 10% by weight, based on the dry weight of the layer.

11. The recording material as set forth in claim 1, wherein the amount of the pigment is from about 0.1 to about 5% by weight, based on the dry weight of the layer.

12. The recording material as set forth in claim 1, wherein the photosensitive image layer is a positive-working layer including naphthoquinonediazides.

13. The recording material as set forth in claim 1, wherein the photosensitive image layer is a positive-working layer including combinations of compounds which form a strong acid on exposure to radiation, and compounds which contain at least one C—O—C bond cleavable by an acid.

14. The recording material as set forth in claim 1, wherein the photosensitive image layer is a positive-working layer and wherein said positive working layer is based on thermal systems.

15. The recording material as set forth in claim 1, wherein the photosensitive image layer is an electrophotographic layer.

16. The recording material as set forth in claim 1, wherein the photosensitive image layer is a negative-working layer which includes compounds having diazonium salt groups.

17. The recording material as set forth in claim 1, wherein the photosensitive image layer is a negative-working layer and wherein said negative working layer includes photopolymer systems.

18. The recording material as set forth in claim 1, wherein the radiation-sensitive image layer has a layer weight of from about 0.1 to about 6 $g/m^2$.

19. The recording material as set forth in claim 1, wherein the radiation-sensitive image layer has a layer weight of from about 0.5 to about 4 $g/m^2$.

20. The recording material as set forth in claim 1, wherein th e backing coating has a thickness of from about 0.1 to about 20 μm.

21. The recording material as set forth in claim 1, wherein the backing coating has a thickness of from about 0.5 to about 10 μm.

22. The recording material as set forth in claim 1, wherein the backing coating has a thickness of from about 1 to about 8 μm.

23. The recording material as set forth in claim 1, wherein the backing coating of the substrate includes compounds which have been polymerized, condensed or crosslinked by heat and/or radiation.

24. The recording material as set forth in claim 1, wherein the backing coating further contains at least one additive.

25. The recording material as set forth in claim 24, wherein said at least one additive is selected from the group consisting of plasticizers, dyes, pigments, silicone compounds, and surfactants.

26. The recording material set forth in claim 1, further comprising a top most layer above said photosensitive layer.

27. The recording material set forth in claim 26, wherein said top most layer is continuous.

28. The recording material set forth in claim 1, wherein said top layer is continuous.

29. The recording material set forth in claim 1, wherein said photosensitive layer is continuous.

* * * * *